United States Patent
Hamada et al.

(10) Patent No.: US 6,886,521 B2
(45) Date of Patent: May 3, 2005

(54) SLIDING STRUCTURE FOR AUTOMOTIVE ENGINE

(75) Inventors: Takahiro Hamada, Yokohama (JP); Yutaka Mabuchi, Yokohama (JP); Makoto Kano, Yokohama (JP); Yoshiteru Yasuda, Yokohama (JP); Yusuke Okamoto, Kanagawa (JP)

(73) Assignee: Nissan Motor Co., Ltd., Yokohama (JP)

(*) Notice: Subject to any disclaimer, the term of this patent is extended or adjusted under 35 U.S.C. 154(b) by 0 days.

(21) Appl. No.: 10/682,559

(22) Filed: Oct. 10, 2003

(65) Prior Publication Data

US 2004/0074467 A1 Apr. 22, 2004

(30) Foreign Application Priority Data

Oct. 16, 2002 (JP) ........................... 2002-302205

(51) Int. Cl.$^7$ ................................ B26D 5/00
(52) U.S. Cl. .................... 123/193.4; 427/450
(58) Field of Search .............. 123/193.1–193.6; 427/450, 540, 250; 428/698, 217; 92/158

(56) References Cited

U.S. PATENT DOCUMENTS

| | | | | | |
|---|---|---|---|---|---|
| 3,932,228 | A | * | 1/1976 | Sugiyama et al. | ........ 123/193.2 |
| 5,148,780 | A | * | 9/1992 | Urano et al. | .............. 123/193.2 |
| 5,960,762 | A | * | 10/1999 | Imai | .......................... 123/193.4 |
| 6,142,481 | A | * | 11/2000 | Iwashita et al. | .............. 277/443 |
| 6,553,957 | B1 | * | 4/2003 | Ishikawa et al. | .......... 123/193.2 |
| 6,562,445 | B2 | * | 5/2003 | Iwamura | ..................... 428/217 |
| 6,726,993 | B2 | * | 4/2004 | Teer et al. | ................... 428/408 |
| 6,739,238 | B2 | * | 5/2004 | Ushijima et al. | .............. 92/158 |

FOREIGN PATENT DOCUMENTS

| | | |
|---|---|---|
| EP | 0 333 416 A1 | 9/1989 |
| JP | 7-118832 A | 5/1995 |
| JP | 11-294118 A | 10/1999 |
| JP | 2000-119843 A | 4/2000 |
| JP | 2000-297373 A | 10/2000 |
| JP | 2000-327484 A | 11/2000 |
| JP | 2001-64005 A | 3/2001 |
| JP | 2001-172766 A | 6/2001 |
| JP | 2002-309912 A | 10/2002 |
| JP | 2003-88939 A | 3/2003 |
| WO | WO 97-14555 A1 | 4/1997 |

OTHER PUBLICATIONS

"Chromium Steels", Japanese Industrial Standard, 1979, pp. 1–9, JIS G 4104, Japanese Standards Association, Japan.

* cited by examiner

Primary Examiner—Marguerite McMahon
(74) Attorney, Agent, or Firm—Foley & Lardner LLP

(57) ABSTRACT

A sliding structure for an automotive engine includes a sliding member with a sliding portion and a lubricant applied to the sliding portion so that the sliding portion can make sliding contact with a counterpart member via the lubricant. The sliding member is either of a piston ring, a piston pin, a cam lobe, a cam journal, a plain bearing, a rotary vane and a timing chain. The sliding portion has a base made of a steel or aluminum material and a hard carbon film formed on the base to coat the sliding portion. The hard carbon film has a thickness of 0.3 to 2.0 $\mu$m, a Knoop hardness of 1500 to 4500 kg/mm$^2$, a surface roughness Ry ($\mu$m) satisfying the following equation: Ry<{(0.75−Hk/8000)×h+0.07/0.8}, where h is the thickness ($\mu$m) of the film; and Hk is the Knoop hardness (kg/mm$^2$) of the film.

6 Claims, 1 Drawing Sheet

SLIDING STRUCTURE FOR AUTOMOTIVE ENGINE

BACKGROUND OF THE INVENTION

The present invention relates to a sliding structure for an automotive internal combustion engine that has excellent friction characteristics and high durability. More specifically, the present invention relates to a sliding structure for use in an automotive engine valve train or intake/exhaust system in which the sliding portion of a sliding member is coated with a specific hard carbon film to attain a low friction coefficient and high durability, reliability and seizure resistant.

A valve train and an intake/exhaust system of an automotive internal combustion engine include various sliding members, such as a cam lobe and its counterpart member, i.e., a valve lifter or a shim attached to an end face of the lifter. Above all, the sliding friction between the cam lobe and the lifter accounts for 20% of the total engine mechanical loss when the engine runs at low speeds (including idling speed). The technique of reducing the friction between the cam lobe and the lifter is important to provide a direct improvement of vehicle fuel efficiency. Herein, the surface pressure developed by sliding contact between the cam lobe and the lifter is among the highest in the internal combustion engine, and the lubrication between the cam lobe and the lifter is temporarily cut off due to their sliding mechanism. It can be thus said that the lubrication state of the cam lobe and the lifter is extremely severe. There are some conceivable effective ways to reduce the sliding friction between the cam lobe and the lifter. For example, the sliding portions of both the cam lobe and the lifter can be smoothed to improve the lubrication state and thereby reduce direct contact (metal contact) between the cam lobe and the lifter. A solid lubricant or lubricant additive may be used to reduce the friction on metal contact between the cam lobe and the lifter. In view of the foregoing, it is proposed to smooth the sliding portion of the lifter, and then, coat the sliding portion with a hard thin film of titanium nitride (TiN) or chromium nitride ($Cr_2N$) or a resinous material containing therein a solid lubricant e.g. molybdenum disulfide ($MoS_2$).

The greatest merit of a hard thin film formed by a physical vapor deposition (PVD) method or a chemical vapor deposition (CVD) method is its surface hardness much higher than that attained by surface treating (e.g. plating) or surface hardening (e.g. heat treatment). By the application of such a hard thin film to a sliding member, the wear resistance of the sliding member can be significantly improved to prevent a deterioration in surface roughness under lubrication. Also, the sliding member can be prevented from wearing away its counterpart member due to the deterioration in surface roughness. It is thus possible to keep the sliding friction from increasing owing to an increase in the direct contact (metal contact) between the sliding member and the counterpart member and possible to maintain the initial lubrication state over an extended time period. In addition, it is expected that the application of the hard thin film to the sliding member would provide a smoothing effect on the counterpart member such that the sliding portions of both the sliding member and the counterpart member can be smoothed for improvement of the lubrication state.

Among various hard carbon films, amorphous carbon films such as a diamond-like carbon (DLC) film are known for high hardness and solid-lubricant-like ability to provide a low friction coefficient with no lubricant. In microscopic analysis, the sliding contact between the sliding member and the counterpart member under lubrication includes a region in which the sliding member makes sliding contact with the counterpart member via a lubricant film and a region in which the sliding member and the counterpart member make direct contact (metal contact) between their surface roughness peaks. With the expectation that the sliding friction between the sliding member and the counterpart member can be reduced under no lubrication, the application of the DLC film to the sliding member, notably the region in which the sliding member makes direct contact with the counterpart member, has been recently examined as a low-friction technique for the internal combustion engine.

However, the hard carbon film formed by the PVD or CVD method has higher internal stress and hardness than that formed by surface treating (e.g. plating). In the application of such a hard carbon film to the sliding member, there arise a problem that the hard thin film often becomes separated from the base portion of the sliding member and/or becomes cracked.

In order to prevent the separation of the hard carbon film, it is proposed to provide an intermediate layer so as to improve the adhesion between the film and the base, and to form the film in a multilayer structure to lessen the film internal stress. On the other hand, there are few proposals of preventing the cracking of the hard carbon film and the separation of the hard carbon film resulting from the film cracking by controlling the surface roughness and profile of the hard thin film as well as the surface roughness and profile of the counterpart member. One of such proposals is to control the surface roughness of the cam lobe and the lifter shim (Japanese Laid-Open Patent Publication No. JP 11-294118A). This proposal is based on the principle that the input of load to the film can be controlled by limiting the roughness of the cam lobe and the lifter shim to a given value or smaller. Another proposal is to control the surface profile of the hard carbon film, more specifically to control the height and amount of macro particles (droplets) remaining on the surface of the film formed by arc ion plating (Japanese Laid-Open Patent Publication No. JP7-118832A).

SUMMARY OF THE INVENTION

Some studies have been conducted on the sliding between the cam lobe and the lifter as described above, but very few on the sliding between the cam lobe and the other sliding member and between the other sliding members. Particularly, any study based on the comprehensive analysis of the thickness, hardness and surface roughness of the hard carbon film, the surface roughness of the base portion of the sliding member and the properties of the lubricant, cannot be found.

In addition, the hard carbon film is more brittle than the previously known TiN and CrN films so that the hard carbon film needs to be controlled according to film properties. In order for the sliding member to attain a low friction coefficient and improved durability, reliability and seizure resistance, the influence of lubricant additives also needs to be considered.

It is therefore an object of the present invention to provide a sliding structure for an automotive engine in which the sliding portion of a sliding member is coated with a hard carbon film so as to attain a lower friction coefficient, higher durability and reliability and improved seizure resistance while preventing the cracking and separation of the hard carbon film.

As a result of extensive researches, the inventors have found that the above object can be achieved by adequately controlling the surface roughness and profile of a hard carbon film (such as a diamond-like carbon film), the surface roughness and profile of the base of a sliding member and the properties of a lubricant. The present invention has been accomplished based on this finding.

According to an aspect of the invention, there is provided a sliding structure for an automotive engine, comprising: a sliding member being one selected from the group consisting of a piston ring, a piston pin, a cam lobe, a cam journal, a plain bearing, a rotary vane and a timing chain, and including a sliding portion; and a lubricant applied to the sliding portion so that the sliding portion can make sliding contact with a counterpart member via the lubricant, wherein the sliding portion has a base made of either a steel material or an aluminum material and a hard carbon film formed on the base to coat the sliding portion, and the hard carbon film has a thickness of 0.3 to 2.0 µm, a Knoop hardness of 1500 to 4500 kg/mm², a surface roughness Ry (µm) satisfying the following equation: $Ry<\{(0.75-Hk/8000)\times h+0.07/0.8\}$ where h is the thickness (µm) of the hard carbon film; and Hk is the Knoop hardness (kg/mm²) of the hard carbon film.

The other objects and features of the invention will also become understood from the following description.

DESCRIPTION OF THE EMBODIMENTS

The present invention will be described below in detail. In the following description, all percentages (%) are by mass unless otherwise specified.

A sliding structure according to one exemplary embodiment of the invention includes a sliding member having a sliding portion and a lubricant applied to the sliding portion so that the sliding portion can make sliding contact with a counterpart member via the lubricant.

Figure 1A:
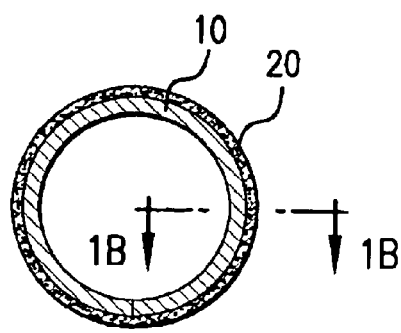
FIG. 1A is a schematic that presents an axial view of a piston ring according to an embodiment of the present invention.
Figure 1B:
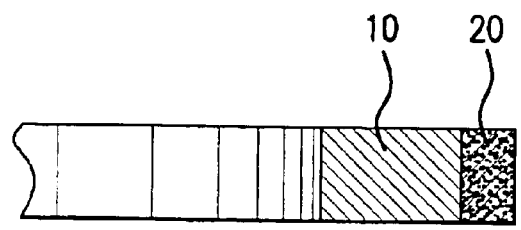
FIG. 1B is a schematic depicting the cross section 1B—1B of FIG. 1A.
Figure 2A:
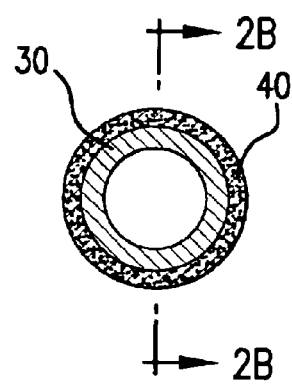
FIG. 2A is a schematic that presents an axial view of a piston pin according to an embodiment of the present invention.
Figure 2B:
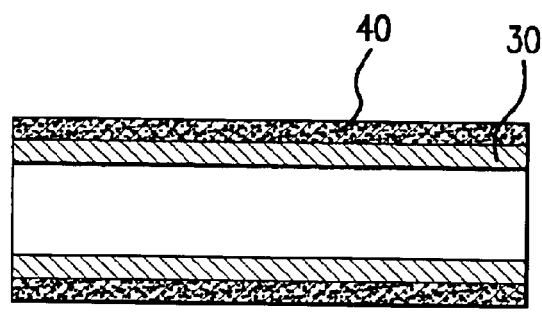
FIG. 2B is a schematic depicting the cross section 2B—2B of FIG. 2A.

The sliding member is designed specifically for use in an automotive engine, and can be in the form of a piston ring, as is represented by way of example only in FIGS. 1A and 1B, a piston pin, as is represented by way of example only in FIGS. 2A and 2B, a piston skirt, a cam lobe, a cam journal, a plain bearing, a rotary vane or a timing chain, or varying combinations thereof. Herein, the piston ring is a ring fit onto a piston to slide against a cylinder. The piston pin is a pin that connects a piston to a connecting rod and slides against the piston, bushing or the connecting rod. The piston skirt is the skirt part of a piston that slides against a cylinder. Each of the cam lobe and the cam journal is used for a camshaft to slide against a valve lifter or a shim so as to drive intake and exhaust valves. The rotary vane is rotatably mounted in the housing (that defines a pump chamber) of an oil pump (such as a base pump) of an automatic transmission so as to slide against the housing, or is rotatably mounted in the cylindrical housing of a hydraulic circuit of a valve train (that variably controls the valve lift characteristics of an intake or exhaust valve) so as to slide against the housing. The timing chain is a continuous roller chain that slides against a sprocket or chain guide so as to drive a camshaft from a crankshaft.

The sliding portion of the sliding member has a base and a hard carbon film formed on the base to coat the sliding portion. By way of example only, the base of the piston ring according to an exemplary embodiment is represented by element 10 in FIGS. 1A and 1B, while the base of the piston pin according to an exemplary embodiment is represented by element 30 in FIGS. 2A and 2B. Further by way of example only, the hard carbon film of the piston ring according to an exemplary embodiment is represented by element 20 in FIGS. 1A and 1B, while the hard carbon film of the piston pin according to an exemplary embodiment is represented by element 40 in FIGS. 2A and 2B.

The base is generally made of either one of a steel material and an aluminum material.

The hard carbon film is made of carbon that contains unavoidable impurities only, and is desirably a diamond-like carbon (DLC) film. Although the DLC film can be formed by any physical vapor deposition (PVD) method, it is particularly desirable to form the DLC film by arc ion plating.

Further, the hard carbon film has a thickness of 0.3 to 2.0 µm, a surface hardness of 1500 to 4500 kg/mm² in terms of Knoop hardness and a surface roughness Ry (µm) satisfying the following equation (A):

$$Ry<\{(0.75-Hk/8000)\times h+0.07/0.8\} \tag{A}$$

where h is the thickness (µm) of the hard carbon film; and Hk is the Knoop hardness (kg/mm²) of the hard carbon film.

The above equation (A) has been experimentally established by the inventors. Namely, experiments have been conducted on the sliding of various combinations of the above sliding members and their counterpart members to find out how the occurrence of damage and separation of the hard carbon film can be influenced by the hardness, surface roughness and thickness of the hard carbon film, the surface roughness and profile of the base and the surface roughness and profile of the counterpart member. As a result of the experiments, it is found that that the hard carbon film sustains damage from sliding when subjected to an excessively large load. It is also found that such damage of the hard carbon film results in film cracking, microscopic film separation or more serious damage caused by scrubbing separated film fragments.

If one of the sliding member and the counterpart member has its sliding portion formed into a plane and the other has its sliding portion formed into a simple curvature, the sliding member and the counterpart member make line contact between their sliding portions such that the hard carbon film receives only a pressure from the line contact. In this case, the hard carbon film can be prevented from becoming cracked by controlling the thickness of the hard carbon film to a give value or larger, without the need to consider the relationship of the above equation (A). In practice, however, there are the following causes for the excessive load on the hard carbon film.

One cause for the excessive load on the hard carbon film is a deposit specific to the thin film formed by any PVD method (such as arc ion plating). The deposit is herein defined as particles coming from the metal target (i.e. the source of a film forming material) in a cluster or molten state but not in an ionic or atomic state, and remaining in the film as they are. The hard carbon film is developed over the deposit so that the deposit remains within the film to form hard particulate protrusions. These protrusions readily come off during the sliding. If the resultant particles are caught into the contact between the sliding member and the counterpart member, the hard carbon film receives a pressure from the counterpart member via the particles. Such a localized pressure is much higher than a Hertz's pressure determined based on the macroscopic curvature of the sliding or counterpart member in consideration of its elastic deformation, and can cause cracking of the film. The hard carbon film is also subjected to shearing stress upon the sliding contact between the sliding member and the counterpart member. The damage of the hard carbon film is developed radially outwardly in line form to cause macroscopic separation of the film.

Another cause for the excess load on the hard carbon film is too large surface roughness of the counterpart member. There are two cases: in one case, the surface roughness peaks of the counterpart member increases the localization of the surface pressure on the film; and, in the other case, the sliding member and the counterpart member make point contact rather than line contact due to their low smoothness to make the contact pressure more localized. Especially when the sliding member and the counterpart member make point contact due to their low smoothness, the cracking of the hard carbon film becomes increasingly promoted under the combined influence of the deposit and the large surface roughness of the sliding member and the counterpart member.

It is also found by the inventors that the cracking of the hard carbon film can be caused depending on the thickness and hardness of the film. As the thickness of the film increases, the deformation of the film caused by pressing the particles against the film under a given load becomes small. The resistance of the film to cracking thus increases. In order to bring about a good lubrication state, it is necessary that the hard carbon film have a certain thickness depending on a conceivable load applied under the sliding conditions. In addition, the hardness and ductility of the film are generally traded off for each other, and the hardness of the film increase with decrease in the ductility of the film. Accordingly, the resistance of the film to cracking increases as the hardness of the film measurably decreases.

The input of load that the hard carbon film (notably the DLC film) can tolerate depends on the surface roughness, thickness and hardness of the film. By adjusting the surface roughness and profiles of the hard carbon film, the base of the sliding member and the counterpart member adequately according to conceivable sliding conditions of the sliding member, it is possible to control the input of load on the film to within certain limits. The hard carbon film can be therefore prevented from becoming cracked and separated such that the film can maintain and perform its function properly over an extended time period.

Based on the above facts, the equation (A) has been established as follows.

It is now assumed that the hard carbon film has a thickness h, a Knoop hardness Hk, a depth h' at which the deposit particles or the roughness peaks of the counterpart member can be pushed into the film upon contact between the sliding member and the counterpart member.

The following equation (1) is experimentally given on the above assumption:

$$h'/h = 0.6 - Hk/10000 \quad (1).$$

The following equation (2) is also experimentally given:

$$a = 0.8 Ry - 0.07 \quad (2)$$

where a is a height of the deposit remaining in the hard carbon film; and Ry is a surface roughness Ry of the hard carbon film.

The deposit remaining in the hard carbon film can be prevented from causing the damage of the film and the cracking and separation of the film resulting from the film damage, by controlling the surface roughness of the film. Namely, the deposit its desired to fit in the above push-in depth to satisfy the following equation (3):

$$a < h' \quad (3).$$

The equation (A) is derived from the equations (1) to (3), so that the surface roughness of the hard carbon film can be controlled according to the hardness and thickness of the film.

The restrictive conditions of the equation (A) will be now explained. The thickness h of the hard carbon film is controlled to 0.3 to 2.0 $\mu$m, as described above. When the thickness of the film is less than 0.3 $\mu$m, there arises a crack in the film under a conceivable load input from the counterpart member. On the other hand, when the thickness of the film exceeds 2.0 $\mu$m, there arises large internal stress in the film during the process of film forming to thereby cause the film to become warped. The warping of the film results in point contact between the sliding member and the counterpart member, and the cracking of the film can be thus accelerated indirectly due to such poor contact. Also, the surface hardness Hk of the hard carbon film is controlled to 1500 to 4500 kg/mm$^2$, as described above, in view of the trade-off between hardness and ductility.

The surface roughness and profile of the base also needs to be controlled according to the kind and characteristics of the sliding member and the kind and properties of the lubricant. Herein, the surface roughness of the base refers to a roughness of the surface of the base on which the hard carbon film is to be formed and is thus normally measured before the formation of the hard carbon film on the base. Desirably, the base has a surface roughness of 0.03 $\mu$m or smaller in terms of Ra (arithmetic mean roughness). As the thickness of the hard carbon film is very small, the surface roughness of the base is reflected to the surface roughness of the film. When the surface roughness of the base is large, the contact surface pressure applied on the film becomes more localized due to the surface roughness peaks of the film to cause the cracking of the film. With the surface roughness Ra of the base being controlled to 0.03 $\mu$m or smaller, however, it becomes possible to prevent the film cracking and the film separation resulting from the film cracking. Moreover, the sliding portion is likely to become convex due to the residual stress of the hard carbon film depending on the profile of the base. If the height of convexity of the sliding portion is too large, the sliding member and the counterpart member undesiredly make point contact rather than line contact so that the surface pressure applied on the film becomes more localized and increased by the deposit and foreign material caught into the contact between the sliding member and the counterpart member. It is thus desirable to control the convexity of the sliding portion to 0.03 $\mu$m or lower after the formation of the film on the base.

The lubricant is predominantly composed of a base oil. The base oil preferably has a kinematic viscosity of 2 to 8 m$^2$/s at 100° C. and a viscosity index of 80 or higher so as to provide a greater friction reducing effect.

Further, the lubricant can additionally contain at least one additive selected from the group consisting of an anti-wear agent, a detergent dispersant, a viscosity index improver, a friction modifier, an anti-forming agent, a pour-point depressant, a rust inhibitor and an antioxidant, so as to reduce the friction coefficient and improve the seizure resistance. Especially, the addition of the anti-wear agent in the lubricant provides a substantial reduction in the friction coefficient. The reason for this is not yet clarified, but it is thought that the film of the lubricant is attached to the hard carbon film by chemical adsorption to take a lubrication action more effectively.

The present invention will be described in more detail by reference to the following example. However, it should be noted that the following example is only illustrative and not intended to limit the invention thereto.

EXAMPLE

A sliding member was formed by preparing a cylindrical piece (as a base) of SCr steel in compliance with JIS G4104 and forming by PVD arc ion plating a DLC film on a surface of the SCr steel piece. The DLC film had a thickness h of 0.5 $\mu$m, a Knoop hardness Hk of 2170 kg/mm$^2$ and a surface roughness Ry of 0.03 $\mu$m.

COMPARATIVE EXAMPLE

In COMPARATIVE EXAMPLE, a cylindrical piece of SCr steel in compliance with JIS G4104 was used as a sliding member. The SCr steel piece used in COMPARATIVE EXAMPLE was the same as that used in EXAMPLE. No DLC film was formed on the SCr steel piece in COMPARATIVE EXAMPLE.

Evaluations

The sliding members of EXAMPLE and COMPARATIVE EXAMPLE were subjected to friction/wear test in order to measure their friction coefficients and seizure loads. The friction/wear test was conducted using a reciprocating-type (SRV) friction/wear tester under the following test conditions. The test results are shown in TABLE.

[Test Conditions]

| | |
|---|---|
| Frequency: | 50 Hz |
| Temperature: | 25° C. |
| Load: | Increased at 130 N/min. |
| Lubricant: | SAE 5W30 |

TABLE

| | Friction Coefficient | Seizure Load (N) |
|---|---|---|
| EXAMPLE | 0.1 | 1110 |
| COMPARATIVE EXAMPLE | 0.17 | 610 |

It is apparent from TABLE that the sliding member of EXAMPLE had more excellent low-friction characteristics and higher seizure resistance than the sliding member of COMPARATIVE EXAMPLE.

As described above, it is possible in the sliding structure of the present embodiment to prevent the hard carbon film from becoming cracked and separated and to attain a low friction coefficient, high durability reliability and improved seizure resistance by adequately controlling the surface roughness and profile of the hard carbon film (notably DLC film), the surface roughness and profile of the base of the sliding member and the lubricant properties.

The entire contents of Japanese Patent Application No. 2002-302205 (filed on Oct. 16, 2002) are herein incorporated by reference.

Although the present invention has been described with reference to specific embodiments of the invention, the invention is not limited to the above-described embodiments. Various modification and variation of the embodiments described above will occur to those skilled in the art in light of the above teaching. The scope of the invention is defined with reference to the following claims.

What is claimed is:

1. A sliding structure for an automotive engine, comprising:
   a sliding member being one selected from the group consisting of a piston ring, a piston pin, a piston skirt, a cam lobe, a cam journal, a plain bearing, a rotary vane and a timing chain, and including a sliding portion; and
   a lubricant applied to the sliding portion so that the sliding portion can make sliding contact with a counterpart member via the lubricant,
   wherein the sliding portion has a base made of either a steel material or an aluminum material and a hard carbon film formed on the base to coat the sliding portion, and the hard carbon film has a thickness of 0.3 to 2.0 $\mu$m, a Knoop hardness of 1500 to 4500 kg/mm$^2$, a surface roughness Ry ($\mu$m) satisfying the following equation:

$$Ry < \{(0.75 - Hk/8000) \times h + 0.07/0.8\}$$

where h is the thickness ($\mu$m) of the hard carbon film; and Hk is the Knoop hardness (kg/mm$^2$) of the hard carbon film.

2. A sliding structure according to claim 1, wherein the hard carbon film is a diamond-like carbon film formed by arc ion plating.

3. A sliding structure according to claim 1, wherein the base has a surface roughness Ra of 0.03 $\mu$m or smaller.

4. A sliding structure according to claim 1, wherein sliding portion coated with the hard carbon film has a convexity of which maximum height is 0.3 $\mu$m or smaller.

5. A sliding structure according to claim 1, wherein the lubricant comprises a base oil having a kinematic viscosity of 2 to 8 m$^2$/s at 100° C. and a viscosity index of 80 or higher.

6. A sliding structure according to claim 1, wherein the lubricant comprises at least one additive selected from the group consisting of an anti-wear agent, a detergent dispersant, a viscosity index improver, a friction modifier, an anti-forming agent, a pour-point depressant, a rust inhibitor and an antioxidant.

* * * * *